United States Patent
Dai et al.

[19]

[11] Patent Number: 6,107,834
[45] Date of Patent: Aug. 22, 2000

[54] CHARGE SHARING PROTECTION FOR DOMINO CIRCUITS

[75] Inventors: Kevin Dai, Fremont, Calif.; Terry Chappell, Portland, Oreg.

[73] Assignee: Intel Corporation, Santa Clara, Calif.

[21] Appl. No.: 09/183,489

[22] Filed: Oct. 30, 1998

[51] Int. Cl.[7] ................................. H03K 19/096
[52] U.S. Cl. ................... 326/98; 326/95; 326/97
[58] Field of Search ................... 326/93, 95, 96, 326/97, 98

[56] References Cited

U.S. PATENT DOCUMENTS

| | | | |
|---|---|---|---|
| 5,440,243 | 8/1995 | Lyon | 326/33 |
| 5,525,916 | 6/1996 | Gu et al. | 326/98 |

*Primary Examiner*—Michael Tokar
*Attorney, Agent, or Firm*—Raymond J. Werner

[57] ABSTRACT

An embodiment of the present invention includes a switchable conductive pathway between a number of intermediate nodes in a domino stage, up to and including every intermediate node, and a voltage source. In operation, this circuit configuration prevents the problems associated with charge sharing. The voltage, at the voltage source which is coupled to the intermediate nodes, is substantially equal to the voltage at a voltage source that is coupled by way of a domino precharge circuit to the output node of the domino stage. The switchable conductive pathways are switched on at the start of the precharge phase, and switched off at the beginning of the evaluation phase. In this way, intermediate node voltages in a domino stage are actively maintained, even after the main precharge control signal has been deasserted. Active maintenance of the intermediate nodes is suspended during the evaluation phase.

In a further aspect of the present invention, the switchable conductive pathways in the domino stages of a first domino chain are controlled by signals that are generated by a second domino chain that is parallel to the first domino chain.

20 Claims, 6 Drawing Sheets

CHARGE SHARING PROTECTION FOR DOMINO CIRCUITS

BACKGROUND OF THE INVENTION

1. Field of the Invention

The invention relates to integrated circuits and more particularly relates to circuit configurations and operations that mitigate the effects of charge sharing.

2. Background

Advances in semiconductor manufacturing technologies have allowed circuit designers to integrate tremendous numbers of transistors on a single die. For example, modern integrated circuits (ICs) commonly include several million transistors interconnected on a single, small substrate. Typically, these are field effect transistors (FETs). At the same time, computer architecture, and more particularly processor architecture, has gone in the direction of emphasizing shorter and shorter cycle times. These advances in semiconductor manufacturing and processor architecture have led designers to consider new ways of implementing basic circuit functions.

Producing integrated circuits with shorter cycle times, means increasing the clock frequency at which these devices operate. Increasing clock frequencies means that fewer logic gate delays are permitted within each clock cycle. Several styles of logic design have been developed to achieve high speed operation. Among these are domino logic circuits.

Domino circuits implemented with complementary metal oxide semiconductor (CMOS) FET configurations provide high speed operation by, among other things, reducing the amount of parasitic junction capacitance at their output nodes as compared to conventional fully static logic implementations of complex logic functions. Unfortunately, such domino circuits have traditionally suffered from noise induced by charge sharing.

What is needed are circuits and methods for providing charge sharing protection for domino circuits.

SUMMARY OF THE INVENTION

Briefly, circuits having dynamic storage nodes are configured to include switchable circuit elements that provide active maintenance of predetermined voltage levels at those nodes, thereby protecting those nodes from charge sharing.

In a further aspect of the present invention, one or more control circuits are provided that control the switching of the switchable circuit elements.

DETAILED DESCRIPTION

Overview

Charge sharing occurs in a domino stage due to a particular set of conditions in the evaluate path. That is, when the precharged output node of the domino stage is coupled to a discharged intermediate node, the charge stored at the output node is "shared" with the discharged intermediate node resulting in a change in voltage at the output node. While the voltage at the output node may be restored by the action of known circuits, for example half-keepers, the momentary voltage change at the output might be sufficient to cause a downstream domino stage to falsely evaluate.

Figure 1:
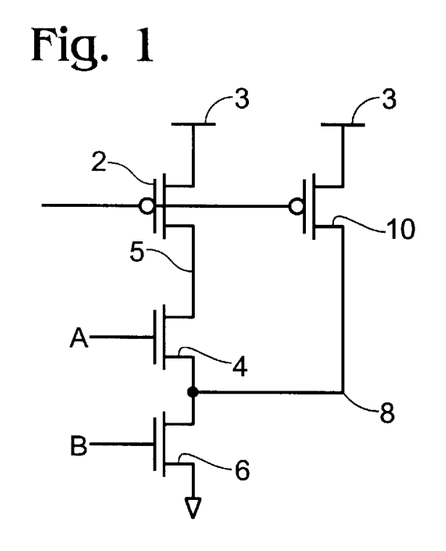
FIG. 1 is a schematic diagram of a circuit that implements precharge clock controlled charge sharing protection.

There are several charge sharing protection schemes that provide some level of protection but do not provide complete maintenance of intermediate node voltages. One example is precharge-clock-controlled charge sharing protection. FIG. 1 shows an example of a circuit that implements this technique. More particularly, an illustrative domino stage includes a PFET precharge device 2 coupled between a positive power supply node 3 and domino output node 5. An NFET 4 is coupled drain-to-source between output node 5 and an intermediate node 8. An NFET 6 is coupled drain-to-source between intermediate node 8 and ground. A PFET 10 is coupled source-to-drain between positive voltage supply 3 and intermediate node 8. PFETs 2 and 10 both have their gate terminals coupled to the same precharge clock node. In this way, when domino output node 5 is precharged, intermediate node 8 is also precharged. PFET 10 maintains the precharge voltage at intermediate node 8 for as long as the precharge clock signal node keeps PFET 10 turned on. However, power management of complex integrated circuits often requires that clocks be stopped to save power. A disadvantage of precharge-clock-controlled charge sharing protection is that it is not suitable for circuits in which the clock is stopped because leakage currents will corrupt intermediate node voltages.

Figure 2:
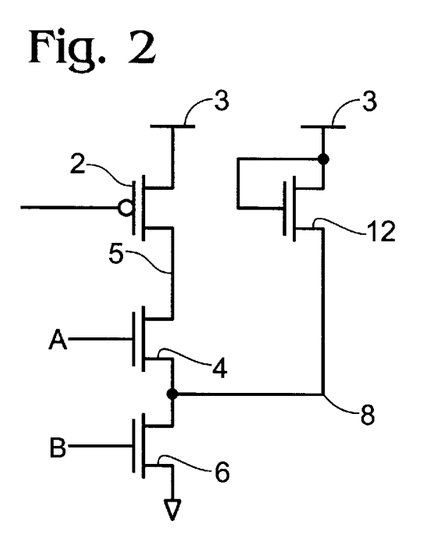
FIG. 2 is a schematic diagram of a circuit that implements source follower charge sharing protection.

Another example is the source follower charge sharing protection circuit, as illustrated in FIG. 2. More particularly, FIG. 2 shows a domino stage as shown in FIG. 1, but in this instance an NFET 12 is coupled between positive voltage supply 3 and intermediate node 8 rather than a PFET as shown in FIG. 1. The gate terminal of NFET 12 is coupled to positive voltage supply 3. In this way, when domino output node 5 is precharged, intermediate node 8 is also precharged, as with the circuit of FIG. 1, however NFET 12 continues to keep intermediate node 8 coupled to positive voltage supply 3 even during the evaluation phase. A disadvantage of this type of source follower charge sharing protection is that it will have a long period of contention with the evaluation path when used in a domino logic stage.

Figure 3:
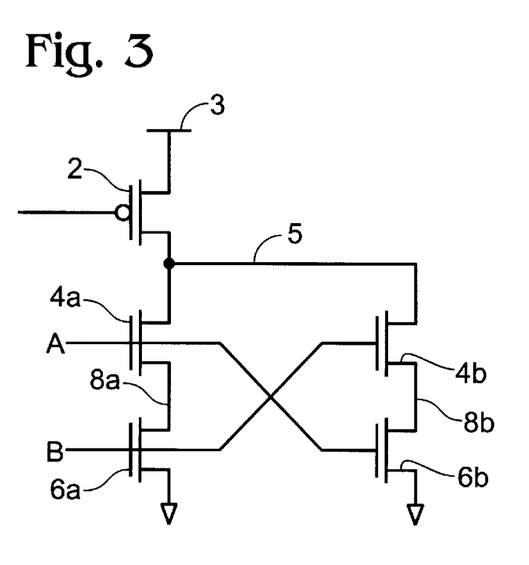
FIG. 3 is a schematic diagram of a circuit that implements symmetric layout charge sharing protection.

A further example of charge sharing protection is the symmetric layout technique illustrated in FIG. 3. The domino stage of FIG. 3 is logically equivalent to the domino stage of FIGS. 1–2 however NFETs 4 and 6 have each been split into two transistors, 4a, 4b, and 6a, 6b respectively. Each of NFETs 4a, 4b, 6a, 6b is about half the size of corresponding NFETs 4 and 6. NFETs 4a, 4b, 6a, 6b are combined into two evaluate paths, each coupled to domino output node 5. The path from output node 5 to ground formed by NFETs 4a and 6a includes intermediate node 8a. Similarly, the path from output node 5 to ground formed by NFETs 4b and 6b includes intermediate node 8b. In this case, the ordering of the connections to input signal nodes A and B are reversed between the stacks. In this way, the amount of capacitance associated with intermediate nodes 8a and 8b is reduced as compared to the amount of capacitance associated with node 8. Since only one of intermediate nodes 8a, 8b can be coupled to domino output node 5 when only one of signals A and B are asserted, the impact of the charge sharing effect is reduced because less charge is shared with the smaller capacitance of the split intermediate nodes 8a, 8b. A disadvantage of symmetric layout charge sharing protection is that this technique will reduce the charge sharing effect by only about 50%, and for complex functions where merger structures exist, symmetric layout requires additional chip area because the merged device must be split when making a symmetrical structure.

An illustrative embodiment of the present invention includes a switchable conductive path between a number of intermediate nodes in a domino stage, up to and including every intermediate node, and a voltage source. In operation, this circuit configuration substantially prevents the problems associated with charge sharing. The voltage, at the voltage source which is coupled to the intermediate nodes, is substantially equal to the voltage at a voltage source that is coupled by way of the domino precharge circuit to the output node of the domino stage. The switchable conductive paths between the intermediate nodes and the voltage source, are switched on at the start of the precharge phase, and turned off at the beginning of the evaluation phase. In this way, intermediate node voltages in a domino stage are actively maintained except during the evaluation phase.

In a further aspect of the present invention, the switchable conductive paths in the domino stages of a first domino chain are controlled by signals that are generated by a second domino chain that is parallel to the first domino chain.

Terminology

The terms, chip, integrated circuit, monolithic device, semiconductor device, and microelectronic device, are often used interchangeably in this field. The present invention is applicable to all the above as they are generally understood in the field.

The terms metal line, trace, wire, conductor, signal path and signaling medium are all related. The related terms listed above, are generally interchangeable, and appear in order from specific to general. In this field, metal lines are sometimes referred to as traces, wires, lines, interconnect or simply metal. Metal lines, generally aluminum (Al), copper (Cu) or an alloy of Al and Cu, are conductors that provide signal paths for coupling, or interconnecting, electrical circuitry. Conductors other than metal are available in microelectronic devices. Materials such as doped polysilicon, doped single-crystal silicon (often referred to simply as diffusion, regardless of whether such doping is achieved by thermal diffusion or ion implantation), titanium (Ti), tungsten (W), tantalum (Ta), nickel (Ni), molybdenum (Mo), and refractory metal silicides are examples of other conductors.

Terminal refers to a connection point. Typically, outputs, or output terminals, are coupled to inputs, or input terminals, to propagate signals.

The terms n-type domino, n-stack domino, NFET evaluate path, and n-channel evaluate path, all refer to a domino stage in which the logical inputs to that domino stage control NFETs that create a path from the domino output node to ground. The terms p-type domino, p-stack domino, PFET evaluate path, and p-channel evaluate path, all refer to a domino stage in which the logical inputs to that domino stage control PFETs that create a path from the output node to a positive voltage supply. Those skilled in the art will understand that domino circuit stages can be implemented with any suitable components and not only FETs.

Evaluate, as used herein with respect to domino stages, refers to the domino output node going to an active state. This active state is a level different from the precharged state.

In the field of digital circuit technology generally, reset refers to bringing an output node to a logical low, or zero. However, with respect to a domino logic stage, reset refers to bringing an output node to the "non-evaluate" state. That is, a domino stage having an n-channel evaluate path will reset to a high level, but a domino stage having a p-channel evaluate path will reset to a low level.

Zipper domino refers to a circuit configuration having a plurality of domino stages connected in series, where the domino stages are alternately n-channel evaluate path stages, and p-channel evaluate path stages.

Keeper refers to a circuit that is added to a dynamic node to maintain that node at a predetermined voltage level. Typically, a keeper is added to a node that, in operation, will periodically be precharged high. The keeper supplies the charge necessary to compensate for the loss of charge due to various leakage paths, as well as loss of charge due to capacitive coupling of the node to other signal paths. A half-keeper is a circuit providing a switchable, direct, conductive pathway between the dynamic node and one voltage source, e.g., a positive voltage source, and therefore operable only to maintain the dynamic node at one level, e.g., a high level. A full-keeper is a circuit providing a switchable, direct, conductive pathway between the dynamic node and two voltage sources, e.g., a positive voltage and ground, and therefore operable to maintain the dynamic node at either a high or low level.

Jam latch refers to a circuit in which a pair of cross-coupled inverters has one of its two nodes electrically coupled to the output of a logic gate. The jam latch is also referred to as a full keeper.

The term "gate" is context sensitive and can be used in two ways when describing integrated circuits. As used herein, gate refers to a circuit for realizing an arbitrary logical function when used in the context of a logic gate. Gate refers to the insulated gate terminal of a three terminal FET when used in the context of transistor circuit configuration. Although a FET can be viewed as a four terminal device when the semiconductor body is considered, for the purpose of describing the circuit configurations of the present invention, the FET will be described using the traditional gate-drain-source, three terminal model unless the circuit configuration calls for modulation of the FET body voltage.

Circuit Configuration

Figure 4:
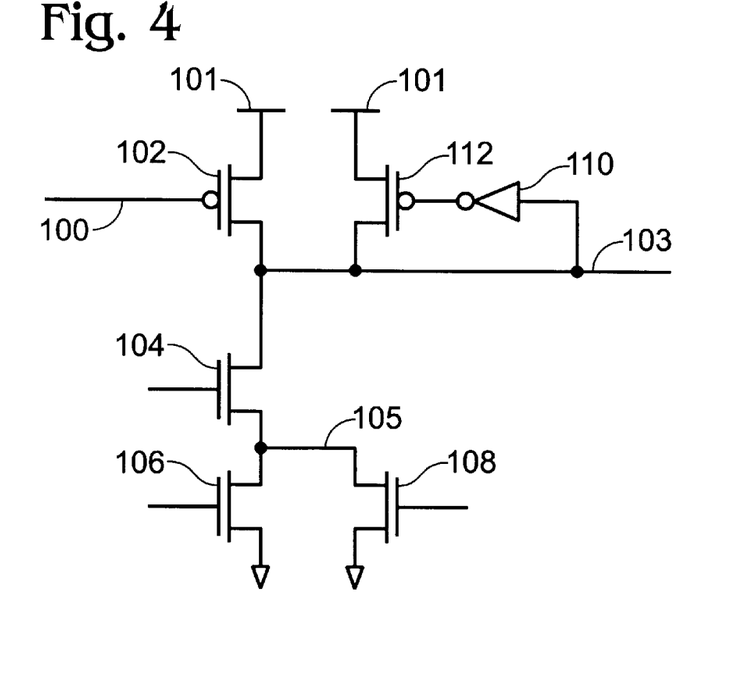
FIG. 4 is a schematic diagram of an NFET evaluate domino stage having an intermediate node in the evaluate path.
Figure 5:
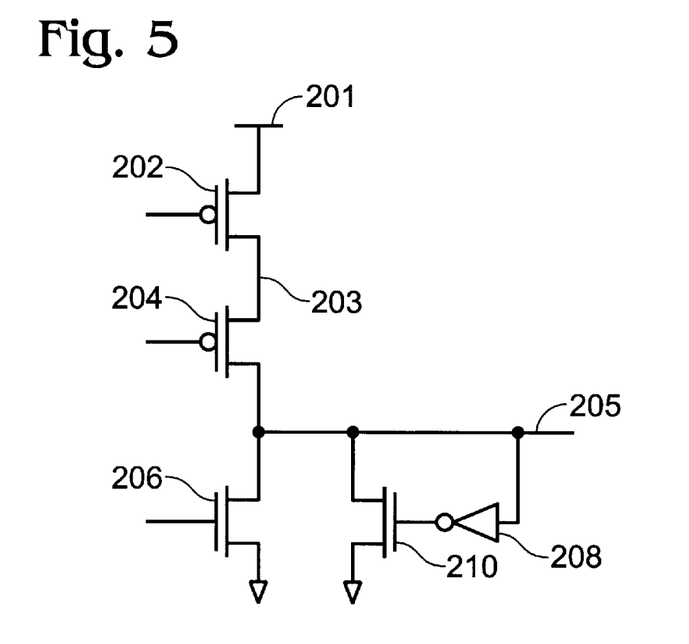
FIG. 5 is a schematic diagram of a PFET evaluate domino stage having an intermediate node in the evaluate path.

FIGS. 4–5 show transistor level schematics of domino stages having intermediate nodes. More particularly, FIG. 4 shows an NFET evaluate path domino stage that includes a PFET 102 coupled source-to-drain between a first power supply node 101 and a domino stage output node 103. An NFET 104 is coupled drain-to-source between output node 103 and an intermediate node 105. An NFET 106, and an NFET 108, are both coupled drain-to-source between intermediate node 105 and ground. An inverter 110 has an input terminal coupled to domino output node 103. Inverter 110 has an output terminal coupled to the gate terminal of a PFET 112. PFET 112 is coupled source-to-drain between power supply node 101 and domino output node 103. Together, inverter 110 and PFET 112 form a half-keeper.

FIG. 5 shows a PFET evaluate path domino stage that includes a PFET 202 coupled source-to-drain between a power supply node 201 and an intermediate node 203. A PFET 204 is coupled source-to-drain between intermediate node 203 and domino output node 205. An NFET 206 is coupled drain-to-source between domino output node 205 and ground. An inverter 208 has an input terminal coupled to domino output node 205. Inverter 208 has an output terminal coupled to the gate terminal of an NFET 210. NFET 210 is coupled drain-to-source between domino output node 205 and ground. Together, inverter 208 and NFET 210 form a half-keeper.

Figure 6:
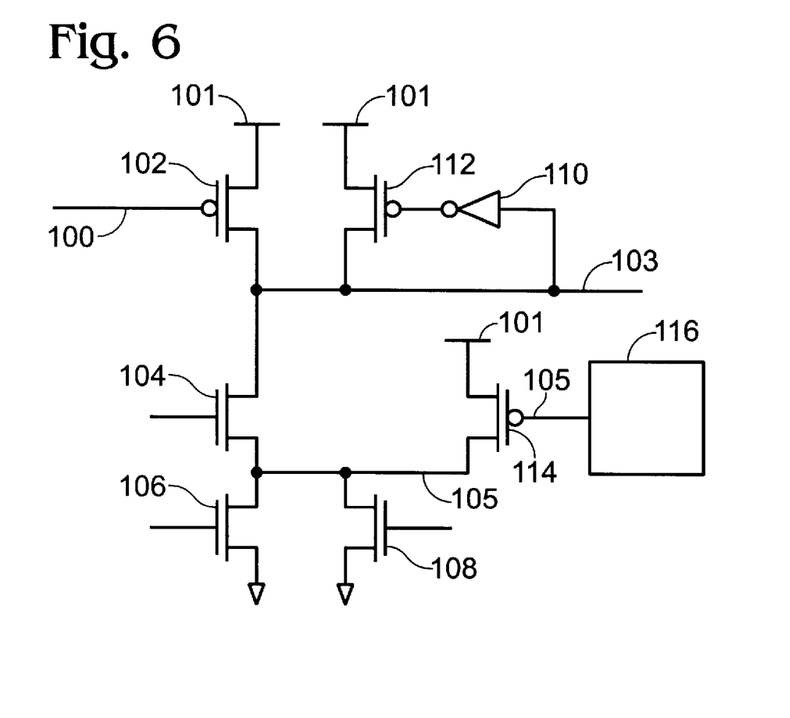
FIG. 6 is a schematic diagram of an NFET evaluate domino stage having a charge sharing protection device coupled to an intermediate node in accordance with the present invention.
Figure 7:
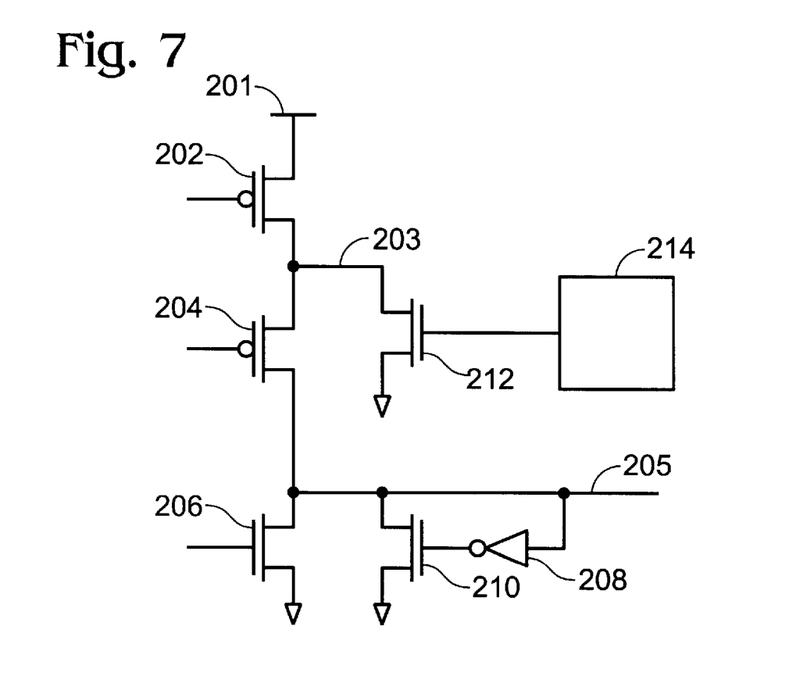
FIG. 7 is a schematic diagram of a PFET evaluate domino stage having a charge sharing protection device coupled to an intermediate node in accordance with the present invention.

Domino stages having charge sharing protection devices in accordance with the present invention are shown and described in conjunction with FIGS. 6–7. Charge sharing protection devices may also be referred to as secondary precharge devices.

FIG. 6 is similar to FIG. 4, except that a charge sharing protection device and its associated control circuitry have been included. Referring to FIG. 6, a PFET 114 is coupled source-to-drain between power supply node 101 and intermediate node 105. The gate terminal of PFET 114 is coupled to a control circuit 116.

FIG. 7 is similar to FIG. 5, except that a charge sharing protection device and its associated control circuitry have been included. Referring to FIG. 7, an NFET 212 is coupled drain-to-source between intermediate node 203 and ground. The gate terminal of NFET 212 is coupled to a control circuit 214.

In the illustrative embodiment of the present invention shown in FIG. 6, PFET 114 is used to precharge intermediate node 105 in an NFET evaluate path to a predetermined voltage level. PFET 114 is referred to herein as a charge sharing protection device. PFET 114 is further used to maintain the predetermined voltage level by supplying the charge needed to compensate for charge lost by various mechanisms, including but not limited to junction leakage, capacitive coupling, and conduction from node 105 to ground through NFET 106.

The NFET evaluate domino stage of FIG. 6, has only one intermediate node. Those skilled in the art will recognize that a domino stage may be configured with more than one intermediate node. In the case where a domino stage has more than one intermediate node, one PFET may be present for, and coupled to, each intermediate node in a domino evaluate path. Alternatively, a single PFET may be coupled to all, or any number, of the intermediate nodes in the domino evaluate path.

Similarly, as shown in FIG. 7, NFET 212 is used to precharge intermediate node 203 of the PFET evaluate path to a predetermined voltage level. NFET 212 is referred to herein as a charge sharing protection device. NFET 212 is further used to maintain the predetermined voltage level by removing the charge needed to compensate for charge gained by various mechanisms, including but not limited to junction leakage, capacitive coupling, and conduction from power supply node 201 to intermediate node 203 through PFET 202.

As described above in connection with PFET charge sharing protection devices, when there is more than one intermediate node in a PFET evaluate domino stage, one NFET may be coupled to each intermediate node in the domino evaluate path, or a single NFET may be coupled to all, or any number of, the intermediate nodes in the domino evaluate path.

If all the charge sharing protection devices in the same domino stage are implemented as FETs, then typically those FETs share a common control signal on their gates. Those skilled in the art will recognize that although it is most common to switch a FET on and off by controlling the voltage applied to the gate terminal of the FET, it may also be possible to control the switching of a FET by modulating the body voltage of the FET. The body voltage may also be referred to as the well voltage, or the substrate voltage, depending upon the specific physical implementation of the FET.

While, the NFET and PFET arrangement described above is the preferred configuration, those skilled in the art and having the benefit of this disclosure will recognize that various other circuit configurations can be used to provide charge to the intermediate nodes of a domino stage. By way of example and not limitation, an NFET can be substituted for the PFET described above in connection with an NFET evaluate path. In this case, the voltage level transferred through the NFET will typically be less than the voltage level of the voltage supply to which it is connected because of the well-known threshold voltage drop. However, in order to compensate for the threshold drop, the NFET may be connected to a supply voltage that is greater than the supply voltage to which the domino output node is precharged. Alternatively, or in combination with a change to the supply voltage, a low threshold voltage NFET may be used to avoid the issues involved with transferring a voltage to the intermediate nodes that is different from the voltage to which the domino output node is precharged. In a still further alternative configuration, the gate terminal of an NFET charge sharing protection device may be coupled to a signal having a high voltage level that is greater than the voltage level of the voltage supply. In this way the problems associated with the threshold drop may be overcome. Those skilled in the art and having the benefit of this disclosure will appreciate that complementary circuit configurations for PFET charge sharing protection devices in p-channel evaluate path domino stages are possible.

Figure 8:
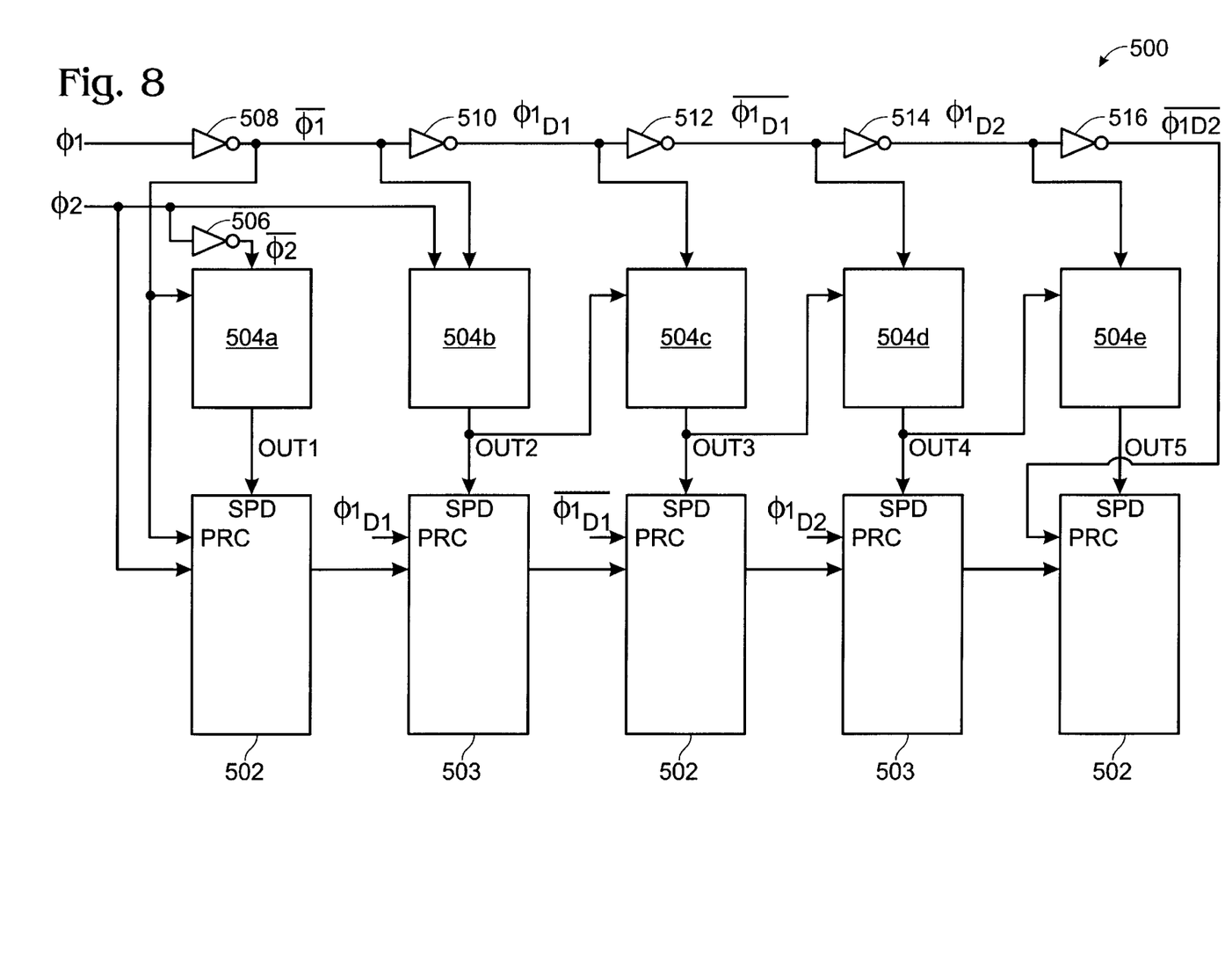
FIG. 8 is a block diagram of a domino pipeline of domino stages having charge sharing protection devices and a control signal generator coupled to the charge sharing protection devices of the domino stages.

FIG. 8 shows a block diagram of a circuit 500 in which several domino stages 502, 503 having charge sharing protection devices are coupled in series to form a pipeline. In this illustrative embodiment, domino stages 502 are NFET evaluate path stages, and domino stages 503 are PFET evaluate path stages. An example of an NFET evaluate path domino stage with a charge sharing protection device (alternatively called a secondary precharge device) is shown in FIG. 6. Similarly, an example of a PFET evaluate path domino stage with a charge sharing protection device is shown in FIG. 7. Alternating NFET evaluate path domino stages and PFET evaluate path domino stages in this manner results in a domino pipeline that is sometimes referred to as zipper logic.

Each domino stage 502, 503 has a precharge input terminal and a secondary precharge input terminal. Those skilled in the art will appreciate that domino logic stages typically have various data input terminals. For the purpose of more clearly illustrating the present invention these various data input terminals are not shown. However, FIG. 8 does show the precharge, and secondary precharge connections for the domino stages 502, 503, as well as the evaluate clock input connection for a first domino stage 502, and a series of connections from the domino output node terminal of each domino stage to a data input terminal of the next sequential domino stage in the pipeline.

Additionally, FIG. 8 shows circuit blocks 504a, 504b, 504c, 504d, 504e, that generate the secondary precharge control signals OUT1, OUT2, OUT3, OUT4, and OUT5 respectively. FIG. 8 further shows a plurality of inverters 506–516 that are used to generate various inverted and delayed versions of two-phase non-overlapping clock signals PHI1 and PHI2.

Circuit blocks 504a, 504b, 504c, 504d, 504e include domino stages coupled so as to form a domino chain. The beginning of precharge triggers the start of charge sharing protection and the beginning of evaluation triggers turning off the charge sharing protection devices.

Figure 9:
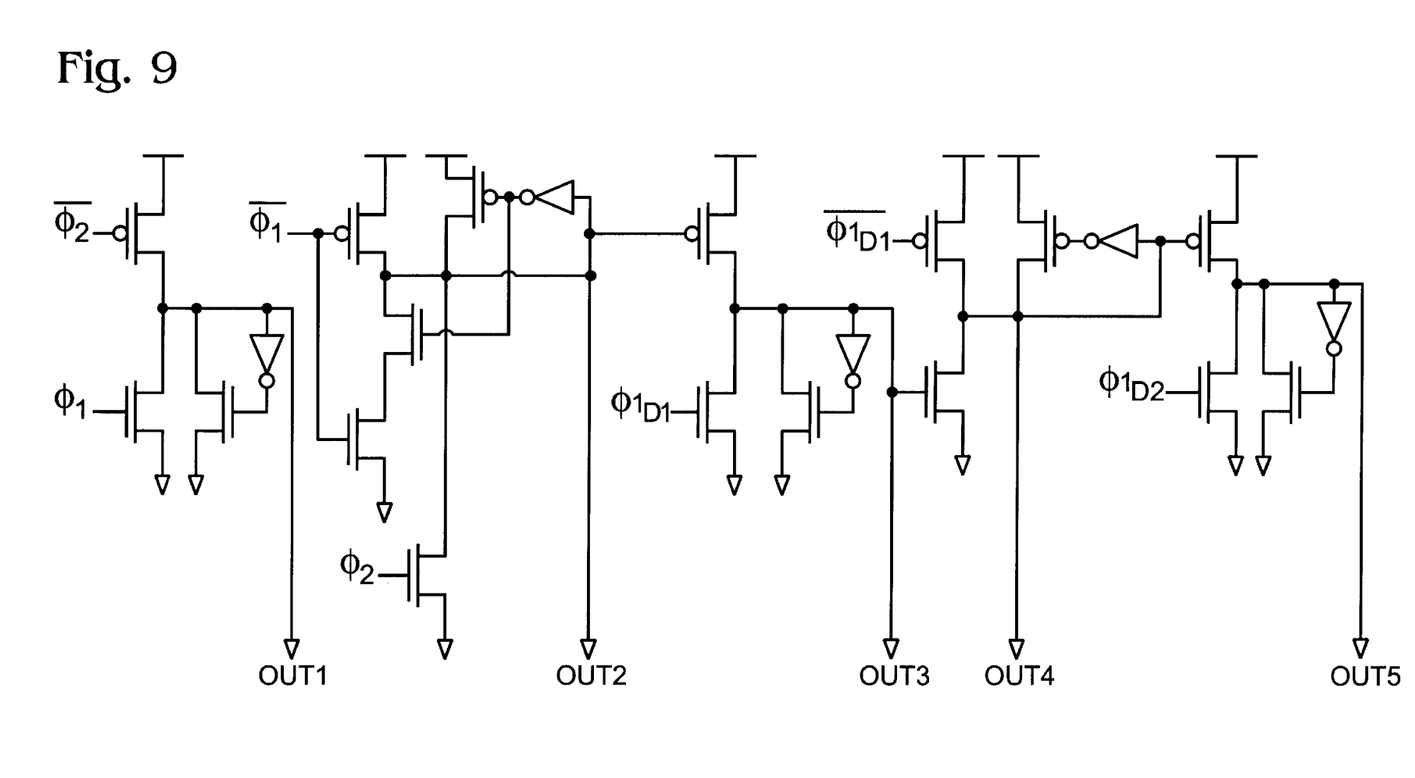
FIG. 9 is a schematic diagram of control signal generation circuitry in accordance with the present invention.
Figure 10:
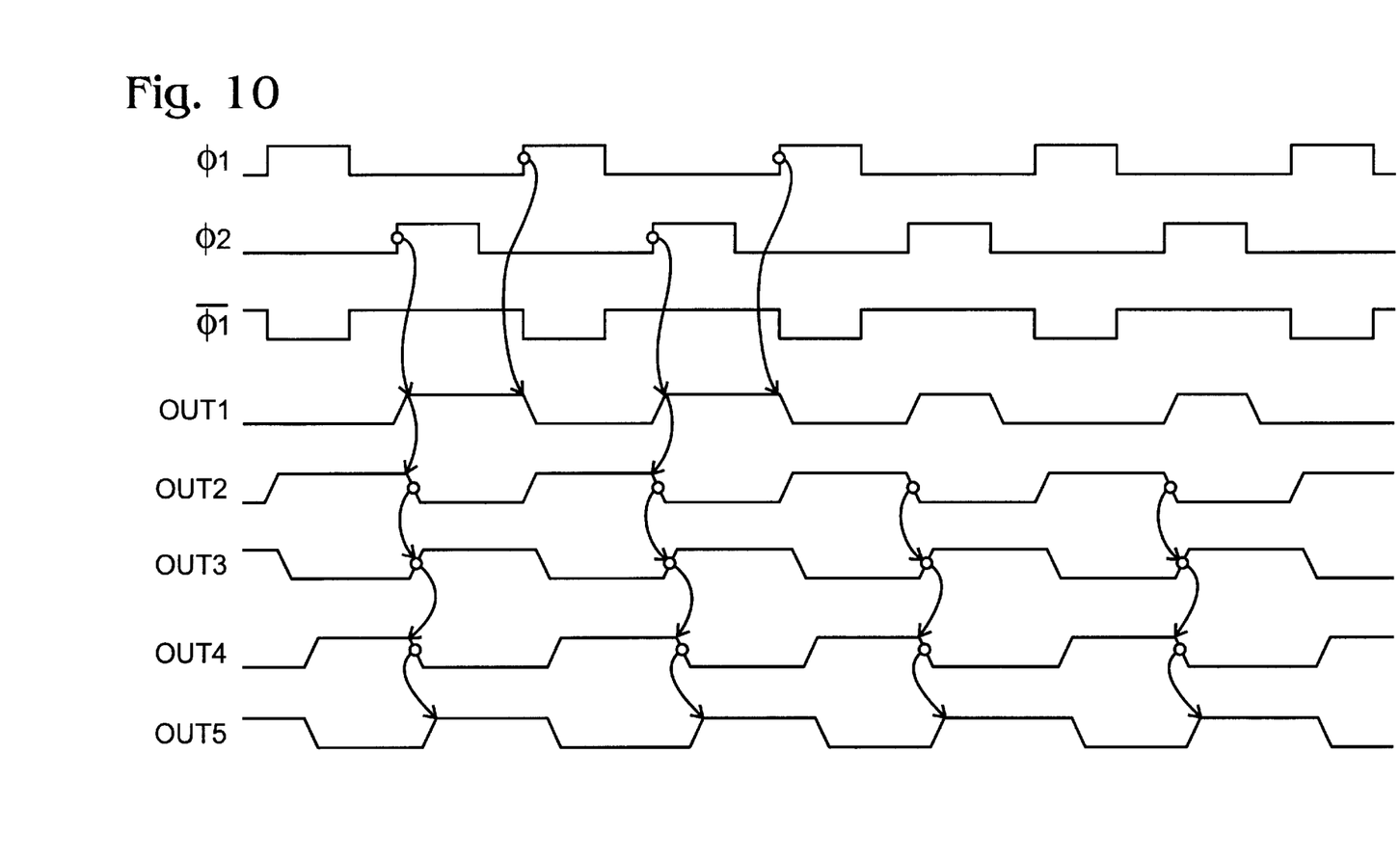
FIG. 10 is a timing diagram illustrating the operation of the control circuit of FIGS. 8–9, in accordance with the present invention.

FIG. 9 shows a transistor level schematic diagram of the domino chain formed by circuit blocks 504a, 504b, 504c, 504d, 504e. FIG. 10 shows an example of the timing relationship between the two-phase non-overlapping clock signals and the various secondary precharge device control signals OUT1, OUT2, OUT3, OUT4, and OUT5.

Circuit Operation

Domino stages in accordance with the present invention, such as those illustrated in FIGS. 6–7, typically have a main precharge device that is used to precharge the domino output node (alternatively referred to as resetting the domino output node). After the output node has been precharged the main precharge device turns off and the output node is maintained at the precharge level by a circuit such as the half-keepers illustrated in FIGS. 6–7. In accordance with the present invention, charge sharing protection devices (alternatively referred to as secondary precharge devices) are coupled to various intermediate nodes of the domino stages.

Referring now to FIGS. 8–10, the operation of an illustrative embodiment is described. In operation, the illustrative embodiment of the present invention, generates signals that turn on both the main precharge devices and the secondary precharge devices at substantially the same time. In accordance with the present invention the main precharge device turns off after the domino output node is precharged, while the secondary precharge device is kept on until the beginning of the evaluation period of that domino stage.

More particularly, a first domino stage 502, which is an NFET evaluate path domino stage, receives a low active version of the PHI1 clock signal to turn on its PFET main precharge device. Substantially simultaneously, secondary precharge control signal OUT1 goes to a low level in order to turn on the PFET secondary precharge device in first domino stage 502. The secondary precharge device is used to maintain the precharge level at the intermediate nodes of the domino stage. As can be seen in FIG. 10, when the precharge signal (PHI1-bar) is deasserted, OUT1 is still low. OUT1 remains low until the start of PHI2, which is the evaluate clock for first domino stage 502. Similarly, it can be seen that at each sequential domino stage after the first, the main precharge and secondary precharge control signals are asserted substantially simultaneously, whereas the secondary precharge control signal remains active after the main precharge control signal is deasserted. Further the secondary precharge signal becomes deasserted at approximately the same time that the domino output node of the prior domino stage evaluates. In this way the intermediate nodes of each domino stage are actively maintained at their precharge level until it is time for that domino stage to evaluate. As can be seen in FIG. 10, the secondary precharge control signals are timed so that each secondary precharge device may remain active until it is time to evaluate that particular domino stage.

Conclusion

Charge sharing noise is a significant noise source in domino circuits. The present invention provides an efficient solution that enhances the reliability of operation of domino circuits.

An advantage of embodiments of the present invention is that domino circuits are protected against noise induced by charge sharing.

It will be understood by those skilled in the art, and having the benefit of this disclosure, that many design choices are possible within the scope of the present invention. For example, although FETs are shown as charge sharing protection devices, any circuit element that can couple an intermediate node to a power supply node and decouple that intermediate node from the power supply node under the timing constraints imposed by the evaluation phase, could be used as a charge sharing protection device.

It will be understood that various other changes in the details, materials, and arrangements of the parts and steps which have been described and illustrated may be made by those skilled in the art and having the benefit of this disclosure, without departing from the principles and scope of the invention as expressed in the subjoined claims.

What is claimed is:

1. A circuit, comprising:

a first plurality of serially coupled domino stages;

a second plurality of domino stages;

at least one of the first plurality of domino stages having at least one intermediate node between an output node and a first power supply node; and a switchable conductive pathway coupled between the at least one intermediate node and a second power supply node;

wherein the switchable conductive pathway has a control terminal coupled to an output node of at least one stage of the second plurality of domino stages.

2. The circuit of claim 1, wherein the switchable conductive pathway is a PFET.

3. The circuit of claim 1, wherein the switchable conductive pathway is an NFET.

4. The circuit of claim 1, wherein the control terminal is a transistor gate terminal.

5. The circuit of claim 1, wherein the control terminal is a transistor body terminal.

6. The circuit of claim 1, wherein the first power supply node and the second power supply node are shorted together.

7. A circuit, comprising:

a first PFET coupled source-to-drain between a first power supply node and an output node, the first PFET having a first gate terminal;

at least a first and a second NFET, coupled in series between the output node and a second power supply node, such that an intermediate node is formed between the first and second NFETs;

a second PFET coupled source-to-drain between the first power supply and the intermediate node, the second PFET having a second gate terminal; and a control circuit having at least a first and a second output terminal;

wherein the first gate terminal is coupled to the first output terminal and the second gate terminal is coupled to a second output terminal.

8. The circuit of claim 7, further comprising a two-phase non-overlapping clock generator coupled to the control circuit.

9. The circuit of claim 8, wherein the control circuit is adapted to produce signals at its first and second output terminals wherein the signals have substantially the same leading edge, and have different trailing edges.

10. The circuit of claim 8, wherein the control circuit is adapted to turn off the second PFET for a period of time substantially equal to a period of time required to evaluate the circuit.

11. A circuit, comprising:

a first NFET coupled source-to-drain between a second power supply node and an output node, the first NFET having a first gate terminal;

at least a first and a second PFET, coupled in series between the output node and a first power supply node, such that an intermediate node is formed between the first and second PFETs;

a second NFET coupled source-to-drain between the first power supply and the intermediate node, the second NFET having a second gate terminal;

a control circuit having at least a first and a second output terminal;

wherein the first gate terminal is coupled to the first output terminal and the second gate terminal is coupled to the second output terminal.

12. The circuit of claim 11, further comprising a two-phase non-overlapping clock generator coupled to the control circuit.

13. The circuit of claim 12, wherein the control circuit is adapted to produce signals at its first and second output terminals wherein the signals respectively have substantially the same leading edge, and have different trailing edges.

14. The circuit of claim 12, wherein the control circuit is adapted to turn off the second NFET for a period of time substantially equal to a period of time required to evaluate the circuit.

15. A method of maintaining a predetermined voltage level at intermediate nodes of a domino stage evaluate path, the method comprising:

coupling the intermediate nodes to a first voltage source substantially simultaneously with coupling an output node of the domino stage to a second voltage source; and decoupling the intermediate nodes from the first voltage supply for a time interval substantially equal to a time interval required to evaluate the domino stage.

16. The method of claim 15, wherein the first voltage source and the second voltage source are substantially equal.

17. The method of claim 15, wherein coupling comprises switching on a FET.

18. The method of claim 15, wherein the decoupling comprises switching off a FET.

19. A method of maintaining a predetermined voltage level at an intermediate node of a domino stage evaluate path, the method comprising:

coupling the intermediate node to a voltage source through a first transistor, substantially simultaneously with coupling an output node of the domino stage to the voltage source;

decoupling the output node from the voltage source through the first transistor; and subsequently decoupling the intermediate node from the voltage supply.

20. The method of claim 19, wherein decoupling the intermediate node from the voltage supply occurs at approximately the same time as evaluation of the domino stage.

* * * * *